(12) United States Patent
Balakrishnan et al.

(10) Patent No.: US 8,487,417 B2
(45) Date of Patent: *Jul. 16, 2013

(54) PACKAGE FOR A POWER SEMICONDUCTOR DEVICE

(75) Inventors: Balu Balakrishnan, Saratoga, CA (US); Brad L. Hawthorne, Saratoga, CA (US); Stefan Bäurle, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 97 days.

This patent is subject to a terminal disclaimer.

(21) Appl. No.: 12/928,404

(22) Filed: Dec. 10, 2010

(65) Prior Publication Data

US 2011/0108963 A1    May 12, 2011

Related U.S. Application Data

(63) Continuation of application No. 11/974,553, filed on Oct. 15, 2007, now Pat. No. 7,875,962.

(51) Int. Cl.
*H01L 23/495* (2006.01)
(52) U.S. Cl.
USPC ........... 257/670; 257/666; 257/678; 257/698; 257/E23.031
(58) Field of Classification Search
USPC .................. 257/666, 670, 678, 698, E23.031
See application file for complete search history.

(56) References Cited

U.S. PATENT DOCUMENTS

| | | | |
|---|---|---|---|
| 3,590,348 A | 6/1971 | Bertics | |
| 4,507,675 A * | 3/1985 | Fujii et al. | 257/670 |
| 4,617,585 A * | 10/1986 | Yasui | 257/796 |
| 4,833,570 A | 5/1989 | Teratani | |
| 4,951,124 A * | 8/1990 | Sawaya | 257/692 |
| 5,008,794 A | 4/1991 | Leman | |
| 5,072,268 A | 12/1991 | Rumennik | |
| 5,164,891 A | 11/1992 | Keller | |
| 5,258,636 A | 11/1993 | Rumennik et al. | |
| 5,274,259 A | 12/1993 | Grabowski et al. | |
| 5,285,367 A | 2/1994 | Keller | |
| 5,313,082 A | 5/1994 | Eklund | |
| 5,323,044 A | 6/1994 | Rumennik et al. | |
| 5,411,901 A | 5/1995 | Grabowski et al. | |
| 5,423,119 A | 6/1995 | Yang | |
| 5,446,317 A * | 8/1995 | Sato et al. | 257/734 |
| 5,672,910 A * | 9/1997 | Majumdar et al. | 257/690 |
| 6,084,277 A | 7/2000 | Disney et al. | |
| 6,168,983 B1 | 1/2001 | Rumennik et al. | |
| 6,207,994 B1 | 3/2001 | Rumennik et al. | |

(Continued)

*Primary Examiner* — Long Tran
*Assistant Examiner* — Jordan Klein
(74) *Attorney, Agent, or Firm* — The Law Offices of Bradley J. Bereznak (57) ABSTRACT

A package for a semiconductor die includes a die attach pad that provides an attachment surface area for the semiconductor die, and tie bars connected to the die attach pad. The die attach pad is disposed in a first general plane and the tie bars are disposed in a second general plane offset with respect to the first general plane. A molding compound encapsulates the semiconductor die in a form having first, second, third and fourth lateral sides, a top and a bottom. The tie bars are exposed substantially coincident with at least one of the lateral sides. The form includes a discontinuity that extends along the at least one of the lateral sides, the discontinuity increasing a creepage distance measured from the tie bars to the bottom of the package.

8 Claims, 8 Drawing Sheets

U.S. PATENT DOCUMENTS

| | | | |
|---|---|---|---|
| 6,255,722 B1 * | 7/2001 | Ewer et al. | 257/676 |
| 6,281,579 B1 * | 8/2001 | Siu | 257/730 |
| 6,320,258 B1 * | 11/2001 | Mangiagli et al. | 257/730 |
| 6,424,007 B1 | 7/2002 | Disney | |
| 6,465,291 B1 | 10/2002 | Disney | |
| 6,468,847 B1 | 10/2002 | Disney | |
| 6,489,190 B2 | 12/2002 | Disney | |
| 6,501,130 B2 | 12/2002 | Disney | |
| 6,504,209 B2 | 1/2003 | Disney | |
| 6,509,220 B2 | 1/2003 | Disney | |
| 6,552,597 B1 | 4/2003 | Disney | |
| 6,555,873 B2 | 4/2003 | Disney et al. | |
| 6,555,883 B1 | 4/2003 | Disney et al. | |
| 6,563,171 B2 | 5/2003 | Disney | |
| 6,570,219 B1 | 5/2003 | Rumennik et al. | |
| 6,573,558 B2 | 6/2003 | Disney | |
| 6,583,663 B1 | 6/2003 | Disney | |
| 6,603,197 B1 * | 8/2003 | Yoshida et al. | 257/676 |
| 6,633,065 B2 | 10/2003 | Rumennik et al. | |
| 6,635,544 B2 | 10/2003 | Disney | |
| 6,639,277 B2 | 10/2003 | Rumennik et al. | |
| 6,667,213 B2 | 12/2003 | Disney | |
| 6,680,646 B2 | 1/2004 | Disney | |
| 6,724,041 B2 | 4/2004 | Rumennik et al. | |
| 6,730,585 B2 | 5/2004 | Disney | |
| 6,734,714 B2 | 5/2004 | Disney | |
| 6,750,105 B2 | 6/2004 | Disney | |
| 6,759,289 B2 | 7/2004 | Disney | |
| 6,768,171 B2 | 7/2004 | Disney | |
| 6,768,172 B2 | 7/2004 | Rumennik et al. | |
| 6,777,749 B2 | 8/2004 | Rumennik et al. | |
| 6,781,198 B2 | 8/2004 | Disney | |
| 6,787,437 B2 | 9/2004 | Rumennik et al. | |
| 6,787,847 B2 | 9/2004 | Disney et al. | |
| 6,798,020 B2 | 9/2004 | Disney et al. | |
| 6,800,903 B2 | 10/2004 | Rumennik et al. | |
| 6,815,293 B2 | 11/2004 | Disney et al. | |
| 6,818,490 B2 | 11/2004 | Disney | |
| 6,825,536 B2 | 11/2004 | Disney | |
| 6,828,631 B2 | 12/2004 | Rumennik et al. | |
| 6,838,346 B2 | 1/2005 | Disney | |
| 6,865,093 B2 | 3/2005 | Disney | |
| 6,882,005 B2 | 4/2005 | Disney et al. | |
| 6,987,299 B2 | 1/2006 | Disney et al. | |
| 7,095,098 B2 * | 8/2006 | Gerbsch et al. | 257/666 |
| 7,115,958 B2 | 10/2006 | Disney et al. | |
| 7,135,748 B2 | 11/2006 | Balakrishnan | |
| 7,199,461 B2 * | 4/2007 | Son et al. | 257/692 |
| 7,220,629 B2 | 5/2007 | Balakrishnan | |
| 7,221,011 B2 | 5/2007 | Banerjee et al. | |
| 7,253,042 B2 | 8/2007 | Disney | |
| 7,253,059 B2 | 8/2007 | Balakrishnan | |
| 7,335,944 B2 | 2/2008 | Banerjee | |
| 7,361,983 B2 * | 4/2008 | Hayashi et al. | 257/696 |
| 7,381,618 B2 | 6/2008 | Disney | |
| 7,391,088 B2 | 6/2008 | Balakrishnan | |
| 7,459,366 B2 | 12/2008 | Banerjee | |
| 7,468,536 B2 | 12/2008 | Parthasarathy | |
| 7,494,875 B2 | 2/2009 | Disney | |
| 7,557,406 B2 | 7/2009 | Parthasarathy | |
| 7,585,719 B2 | 9/2009 | Balakrishnan | |
| 7,595,523 B2 | 9/2009 | Parthasarathy et al. | |
| 7,875,962 B2 | 1/2011 | Balakrishnan et al. | |
| 2003/0020148 A1 | 1/2003 | Kiyohara | |
| 2004/0089928 A1 * | 5/2004 | Nakajima et al. | 257/678 |
| 2005/0151236 A1 * | 7/2005 | Oliver et al. | 257/685 |
| 2005/0167749 A1 | 8/2005 | Disney | |
| 2006/0261473 A1 * | 11/2006 | Connah et al. | 257/728 |
| 2007/0052072 A1 * | 3/2007 | Iwade et al. | 257/675 |
| 2007/0205503 A1 * | 9/2007 | Baek et al. | 257/712 |

* cited by examiner

PACKAGE FOR A POWER SEMICONDUCTOR DEVICE

This application is a continuation of application Ser. No. 11/974,553, filed Oct. 15, 2007, now U.S. Pat. No. 7,875,962 entitled, "PACKAGE FOR A POWER SEMICONDUCTOR DEVICE", which is assigned to the assignee of the present application.

TECHNICAL FIELD

The present disclosure relates generally to the field of packaging of power semiconductor devices.

BACKGROUND

Power semiconductor devices which include high-voltage field-effect transistor (HVFET) devices and other integrated circuits (ICs) that dissipate high power are well known in the semiconductor arts. Such power semiconductor devices are typically encapsulated within a package that is designed for assembly onto a printed circuit board (PCB). The package usually comprises a die attach pad, typically made of an electrically conductive material such as a copper alloy, on which one or more semiconductor die are mounted. A molding compound encapsulates the semiconductor die and a portion of the leads which may extend beyond the outside of the package for electrical connection to external circuitry. The leads and die attach pad are collectively referred to as the package leadframe. Often times, the package is also designed with a mounting surface for physical attachment to a heat sink that is designed as the primary path for transfer of the heat generated by the power device away from the semiconductor die.

In certain prior art package designs the die attach pad is exposed on the mounting surface to provide low thermal impedance between the semiconductor die and the heatsink. In other package designs the die attach pad is electrically isolated from the heatsink with a thin layer of molding compound disposed between the die attach pad and the mounting surface of the semiconductor package. In these latter designs it is often desirable to maintain the thickness of the molding compound between the die attach pad and the mounting surface as thin as possible to provide a low thermal resistance between die attach pad and the mounting surface.

Many traditional power semiconductor packages with an isolated die attach pad are manufactured in leadframe strips where the die attach pad is mechanically held at only one end during the package molding process. The unsupported end of the die attach pad can therefore have significant mechanical tolerances, or move, during the injection molding of the package molding compound. This, in turn, requires an increased thickness in the molding compound between the die attach pad and the outer mounting surface of the package. An alternative manufacturing process supports the die attach pad initially and then retracts the support during the injection molding process, which improves tolerances but increases the cost of the process and therefore of the finished package. Packages in which the die attach pad is electrically isolated from the mounting surface by a thin layer of molding compound also typically requires the shortest distance along the surface of the package between the leads and the mounting surface (commonly referred to as the creepage distance) to be greater than minimum requirements.

BRIEF DESCRIPTION OF THE DRAWINGS

The present invention will be understood more fully from the detailed description that follows and from the accompanying drawings, which however, should not be taken to limit the invention to the specific embodiments shown, but are for explanation and understanding only. It should also be understood that the elements in the figures are representational, and are not drawn to scale in the interest of clarity.

DESCRIPTION OF EXAMPLE EMBODIMENTS

In the following description specific details are set forth, such as material types, dimensions, structural features, manufacturing steps, etc., in order to provide a thorough understanding of the present invention. However, persons having ordinary skill in the relevant arts will appreciate that these specific details may not be needed to practice the embodiments described.

Figure 1A:
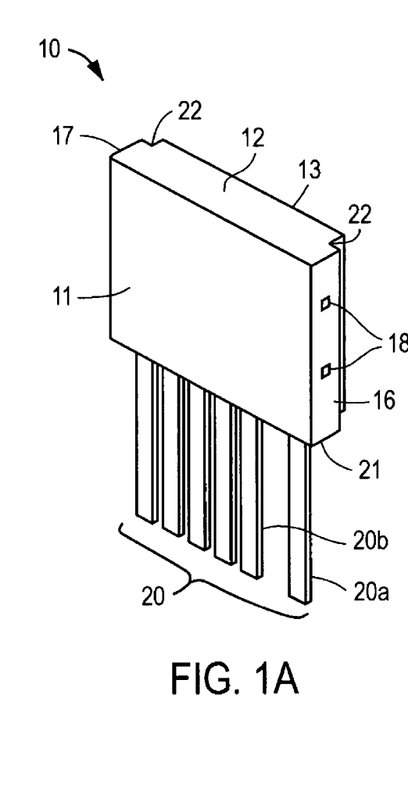
FIGS. 1A & 1B are respective top and bottom side perspective views of an example semiconductor package.
Figure 1B:
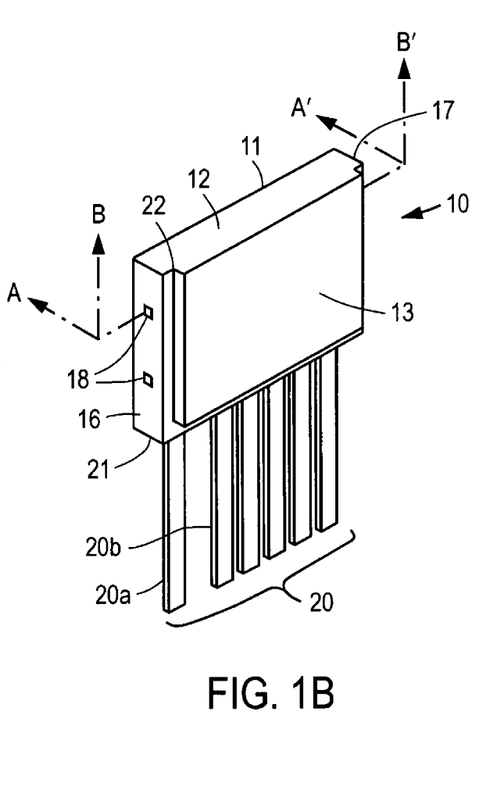

FIGS. 1A & 1B are respective top and bottom side perspective views of an example semiconductor package 10. FIG. 1A is a perspective view from a top side 11 of package 10, whereas FIG. 1B is perspective view from a bottom side or mounting surface 13 of package 10. Mounting surface 13 is the primary path for transfer of the heat generated by the power semiconductor device or devices internal to package 10. As appreciated by those of ordinary skill in the art, mounting surface 13 may be mechanically coupled to a heatsink or other heat transfer element using epoxy, a spring clip, or other known adhesive or mechanical techniques.

Package 10 is also shown including lateral side surfaces 12, 16, 17 and 21. In the embodiment shown, a set of metallic leads 20 extends out of side surface 21. In other embodiments leads may extend from more than one side surface of package 10. In one embodiment, lead 20a is offset or separated from lead 20b by a distance that is greater than the separation of any other two adjacent leads 20. Lead 20a may be wire-bonded to a high voltage region (pad) of the semiconductor die, e.g., a drain of a high-voltage MOSFET, with lead 20b being wire-bonded to a low voltage region (pad) of the die, e.g., a source of a high-voltage MOSFET or a terminal of a low voltage controller. In other embodiments leads 20a & 20b may be bonded to any areas of the active device/die that experience a large voltage potential between them.

Additionally, it should be understood that leads 20a & 20b are physically separated or offset from each other by an appropriate distance in the lateral direction in order to meet creepage distance requirements determined by the voltage potential that is applied between them in the intended application of the package. Creepage distance is the shortest path between two conductive parts measured along the surface of the package separating them. In the context of the present disclosure, creepage distance more specifically refers to a distance along the side surface of the package either from the leads to the bottom mounting surface, or from the tie bars to the bottom mounting surface, which typically is mechanically coupled to a heatsink. A proper and adequate creepage distance protects against a phenomenon known as tracking, which is a process that produces a partially conductive path of localized deterioration of the insulating properties of the surface of the package. The larger the creepage distance between two conductors at different voltage potential, the lower the chance of tracking occurring. Thus, creepage distance requirements for a package are commonly defined by the voltage potentials that are to be applied between conductors during the intended use of the package and the internal semiconductor device. By way of example, the safety standard document published by the International Electrotechnical Commission, IEC 60950-1, provides general guidelines for creepage distance based on voltage appearing between conductive parts and the environment in which the package is used.

In another embodiment, leads $20a$ & $20b$ may be physically separated or offset from each other by a distance in the lateral direction substantially equal to the physical separation between the other leads on the package.

Figure 2A:
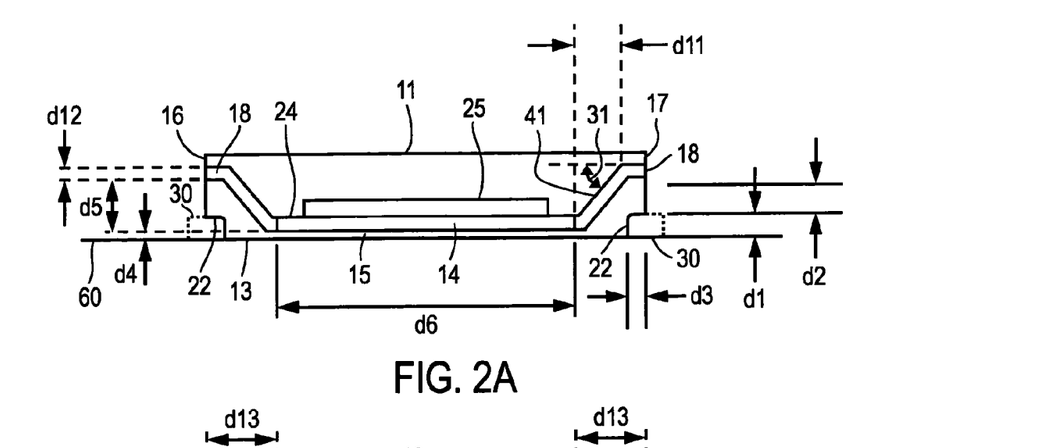
FIG. 2A is a cross-sectional view (as taken through cut lines A-A') of the semiconductor package shown in FIGS. 1A & 1B.
Figure 2B:
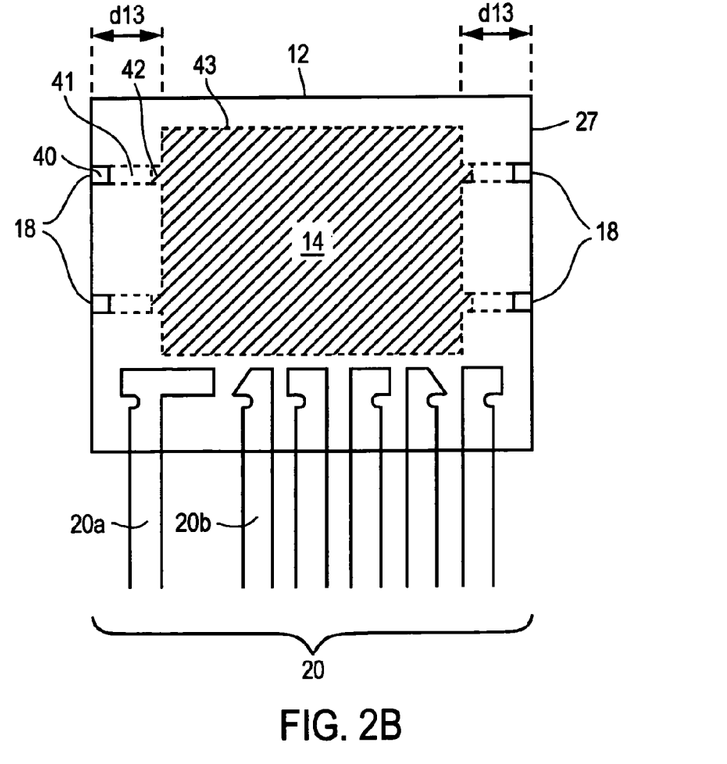
FIG. 2B is a cross-sectional view (as taken through cut lines B-B') of the semiconductor package shown in FIGS. 1A & 1B.

FIGS. 2A & 2B are respective cross-sectional side views taken through cut lines A-A' and B-B' of package shown in FIGS. 1A & 1B. The semiconductor die 25 is shown in FIG. 2A encapsulated in a plastic molding compound material body having a form that defines the perimeter of the package housing formed by top surface 11, lateral side surfaces 12, 16, 17, 21, and bottom or mounting surface 13. The physical volume of the package is defined by this perimeter of the package. Semiconductor die 25 is shown bonded (e.g., solder-bonded, epoxy glued, etc.) to an interior top surface 24 of a die attach pad 14.

In one embodiment, the generally rectangular-shaped plastic housing (defined by box 27 in the view of FIG. 2B) has dimensions of approximately 7.6 mm×10.2 mm. The plastic housing surrounds the metallic lead frame including die attach pad 14, except for the exposed leads 20, which extend out from side 21, and exposed tie bar ends 18 that are shown being severed or trimmed substantially coincident with the surfaces of lateral sides 16 & 17. In other words, die attach pad 14 is completely encapsulated by the molding compound.

The embodiment of FIG. 2A also illustrates that the form of the molding compound material includes a notch 22 that extends along the entire length of each of the sides that have exposed electrical conductors, i.e., sides 16, 17 and 21 of package 10. These electrical conductors include leads 20 extending from side 21 and tie bars 18 on lateral sides 16 and 17. It should be noted that the tie bars are used to support the one or more internal die attach pads of package 10 during the package manufacturing process.

Practitioners in the art will appreciate that when package 10 is insertion-mounted into a PCB, mounting surface 13 is positioned substantially perpendicular to the seating plane of the PCB. Mounted in this manner, the mounting surface 13 provides a thermal surface or plane for direct contact with an external heat sink or heat dissipater. The external heat sink is typically held in place against or affixed to mounting surface 13 using a spring clip, epoxy or other ordinary attachment mechanism. It will be appreciated that by bending the portion of leads 20 that are outside the package 10 through a substantially 90 degree angle, the mounting surface 13 can be arranged to be substantially parallel to the seating plane of the PCB. In such a configuration, mounting surface 13 of package 10 can be held in place against or affixed to the PCB using a spring clip, epoxy or other ordinary attachment mechanism such that the PCB forms the heatsink. In one embodiment therefore, the heatsink may be manufactured of a metallic or other thermally conductive material. In another embodiment, the heatsink may comprise a portion of the PCB to which the leads 20 are electrically coupled. A metal pad patterned on the PCB may be used in this embodiment under the mounting surface 13 of the package, to improve heat conduction to the PCB.

The sectional view of FIG. 2A clearly shows a die attach pad 14 that is deeply downset by a distance d5 in a vertical direction below the general plane where tie bars 18 and leads 20 are disposed. In other embodiments, tie bars 18 may lie in a different general plane as compared to that of leads 20, but die attach pad 14 is still downset below tie bars 18. In another embodiment the leads may be on the same side as one or more of the tie bars. In the embodiment of FIG. 2A, the bottom surface of die attach pad 14 is separated from mounting surface 13 by a portion 15 of the semiconductor package molding material. Portion 15 is shown having a thickness d4. As previously discussed, mounting surface 13 is typically mounted on a heatsink 60.

During the lead frame manufacturing process, a downset tool may be used to push down the die attach pad 14 to a level such that a distance d4 separates the underside of die attach pad 14 and mounting surface 13. When downsetting the die attach pad the tie bars should be bent at an angle less than 90 degrees to maintain the integrity of the tie bars. This prevents breakage or thinning of the tie bar during the down setting process. This means, the higher the height of the tie bars 18 at the outside surface of the package above the plane of the heat sink, the deeper the downset dimension d5, and the longer the horizontal distance d11 required for the angled portion 41 of the tie bar and larger the package needs to be for a given die attach pad size. Thicker lead-frame material allows for sharper bending of the tie-bars without losing integrity. However, to minimize the cost of the package, thinner leadframe material may be used. In one embodiment the maximum downset angle 31 is about 50 degrees using a leadframe thickness d12 of approximately 0.3 mm.

After die attach pad 14 has been downset (i.e., in a general plane that is offset relative to the general plane of the leads and/or tie bars), plastic molding/encapsulation compound is applied. During the package encapsulation process the downset die attach pad 14 may be supported by tie bars 18 on both lateral sides 16 & 17, thereby allowing dimension d4 to be held with a tight tolerance.

In one embodiment, notch 22 is located on a bottom edge of each of lateral sides 16, 17 and 21, and has a vertical height "d1" and a lateral width "d3". In addition, the upper edge of notch 22 is shown being disposed a distance "d2" below the general plane formed by the lower edge of tie bars 18 (which, in the embodiment of FIGS. 1A & 1B, is substantially coincident with the bottom of leads 20). In other embodiments the vertical height of leads 20 above mounting surface 13 may differ from the height of tie bars 18 above mounting surface 13. In other words, the tie bars and the leads need not be disposed in the same general plane.

The sum of the distances d1, d2, and d3 contribute to the creepage distance measured between exposed tie bars 18 and mounting surface 13. In the embodiment of FIG. 2A, the inclusion of notch 22 allows creepage distance requirements for the package between tie bars 18 and mounting surface 13 to be met with a lower vertical height (d1+d2) dimension than would be required in the absence of notches 22 (e.g., substantially perpendicular edges). It is also appreciated that the overall vertical height and therefore physical volume of the semiconductor package is also reduced with the introduction of notch 22.

Note that notch 22 need not extend along the full length of side 21 where leads 20 extend from. That is, in certain embodiments, notch 22 may only extend or be disposed directly under those leads which are subject to a high voltage potential, e.g., lead 20a in FIGS. 1A, 1B and 2B. Similarly, notch 22 need not extend along the full length of the sides where tie bars 18 are exposed; instead, notch 22 may only extend directly under the portion or area of the side surface where the tie bars are disposed.

In one specific implementation of a semiconductor package, the dimensions d1, d2, and d3 are 0.483 mm, 0.635 mm, and 0.406 mm, respectively. In one embodiment, the creepage distance between exposed tie bars 18 and heatsink 60 is greater than or equal to 1.0 mm. In another embodiment, the creepage distance between exposed tie bars 18 and heatsink 60 is less than or equal to 2.0 mm. In one embodiment, the ratio of the clearance distance (d1+d2) to the creepage distance (d1+d2+d3) is about 1:1.28, the clearance distance being the shortest distance through air between two conductive surfaces.

In yet another embodiment, notch 22 is replaced by a protruding piece or step 30 of material, as illustrated by the dotted lines in FIG. 2A. Step 30 is located along the bottom edge of lateral side surfaces 16, 17 & 21, and extends outward by the same distance d3 from each of surfaces 16, 17 & 21 in order to provide an added creepage distance from the exposed tie bars 18 and the leads 20 to the mounting surface 13.

It is further appreciated that notch 22 or step 30 may comprise a number of multiple smaller notches or steps that allows for a further decrease in the clearance dimension (d1+d2) for a given creepage distance between exposed tie bars 18 and mounting surface 13. In still other embodiments, any type or shape of discontinuity (e.g., block, curve, ramp, semicircle, etc.) may be formed at the bottom edge of the side surface as long as the discontinuity increases the creepage distance along the side surface from the tie bar and the leads to the mounting surface of the package in the same manner as that described above. In the context of the present disclosure, a discontinuity refers to any abrupt change (e.g., greater than 15 degrees) in the flatness of the side surface of the package that adds to the creepage distance measured between the tie bars and the bottom mounting surface of the package.

It is also appreciated that notch 22 need not be located substantially coincident with the bottom edge of the lateral sides where the tie bars are exposed. That is, in other embodiments, the notch (or other type of cutout portion) may be provided anywhere along the lateral side between just below tie bars 18 and the mounting surface of the package. Regardless of the exact form of the notches, steps or cut-away portions described above, their presence ensures that the minimum distance between exposed tie bars and the heatsink, which is mechanically coupled to the mounting surface of the package, is substantially less than the associated creepage distance.

It should be understood that decreasing the clearance dimension (d1+d2), for a given creepage distance between tie bars 18 and mounting surface 13, reduces the required downset dimension d5. For a given volume of a package, a reduction in dimension d5 allows for a larger die attach pad dimension d6, which means that the area of die attach pad 14 is increased. Reducing dimension d5 also has the salutary effect of minimizing the physical volume of the semiconductor package for a given creepage distance requirement between exposed tie bars 18 and mounting surface 13. It is appreciated therefore that a package in accordance with the teachings of the present disclosure maximizes the die attach pad area while minimizing the physical volume of the semiconductor package for a given creepage distance between tie bars 18 and heat sink 60. A smaller package volume for a given die attach pad area also reduces the amount of molding compound and area of the lead-frame material, which translates to a lower cost package for a given die size.

As discussed earlier, edge line 27 of FIG. 2B represents the periphery of the package as defined by surfaces 12, 16, 21 and 17. The surface area of die attach pad 14 is shown cross-hatched with a dotted periphery 43. Tie bars 18 are shown severed substantially coincident with the side surfaces (16 & 17) aligned with edge line 27. As can be seen, tie bars 18 provide support for die attach pad 14 at multiple points enabling tight tolerances to be held for thickness d4 in FIG. 2A. In one embodiment the tight tolerances enabled by the support provided by tie bars 18 allows a package to be manufactured with an average thickness d4 in FIG. 2A of about 0.4 mm or less. Other embodiments may have an average thickness d4 that is greater than 0.4 mm. The physical connection between the outer exposed portions of tie bars 18 at edge line 27 and die attach pad 14 is made up of upper portion 40 which is in the same general plane as leads 20. In the embodiment shown, angled portion 41 is disposed at an angle to the plane of die attach pad 14 and lower portion 42, which is in the same general plane as die attach pad 14.

Practitioners in the art will further appreciate that reducing dimension d5 for a given creepage distance between exposed tie bars 18 and mounting surface 13 also has the effect of reducing the dimension d13 measured between each of sides 16 & 17 and the edge of die attach pad 14. For example, in an implementation having a dimension d4=0.3 mm, the ratio of dimension d13 to the creepage distance between exposed tie bars 18 and mounting surface 13 (=d1+d2+d3) is approximately 1.2:1.

In another embodiment, one or more of the leads 20 may be physically coupled to die attach pad 14 to provide further support for the die attach pad 14 and/or to provide an electrical connection to the die attach pad 14.

In still other embodiments, additional tie bars 18 may be connected between die attach pad 14 and the lateral side opposite to where the leads extend from, e.g., side 12 of FIG. 1A. In such embodiments, notch 22 extends along the bottom edge of side surface 12 to achieve the extended creepage distances discussed above with reference to FIG. 2A. Further example embodiments that include tie bars disposed along adjacent lateral sides of the package are discussed below in connection with FIGS. 4B and 5-7.

It is appreciated that tie bars 18, die attach pad 14 and leads 20 form the lead frame of the package. The lead frame design of FIG. 2B is designed to be manufactured as a plurality of lead frames formed in an array or matrix. Matrix lead frame designs use a low cost manufacturing process wherein the complete array or matrix of lead frames are encapsulated in plastic molding compound material with a single injection molding shot. Matrix lead frame arrangements of this type offer a much lower unit cost than traditional strip lead frame power semiconductor packages where only single row of lead frames are molded per injection mold shot. For example, a typical lead frame matrix may comprise sixteen rows of lead frames extending in an x-direction and four columns of lead frames in a y-direction, making a total of sixty-four lead frames that are encapsulated per injection molding shot. It is appreciated that other combinations of rows and columns can be employed.

Figure 3:
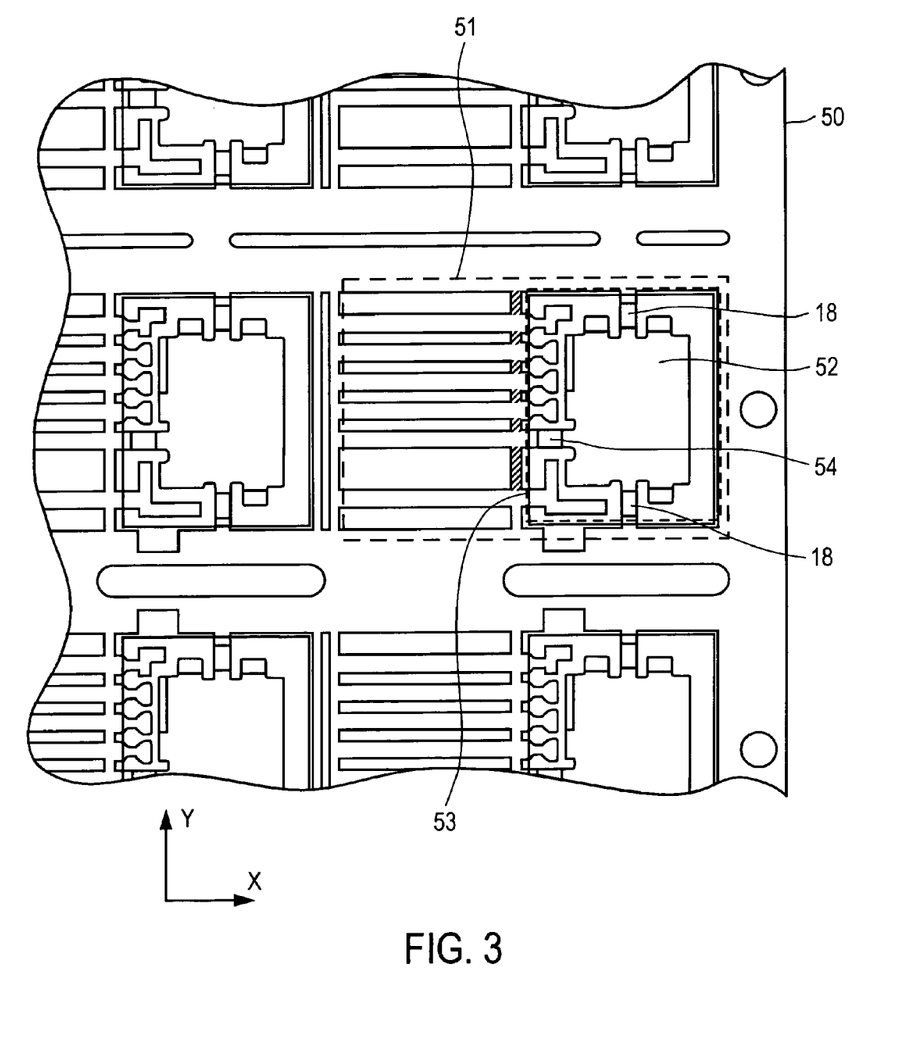
FIG. 3 illustrates an example portion of an array of lead frames.

FIG. 3 illustrates an example portion of an array 50 of lead frames, with an individual leadframe being denoted by dashed line 51. The periphery line 53 identifies the outer periphery of the encapsulated package (i.e., equivalent to line 27 in FIG. 2B). Die attach pad 52 is shown being connected with the surrounding metal of array 50 via tie bars 18 on two sides. It is appreciated that additional support for die attach pad 52 is provided by a lead 54, which is attached to die attach pad 52. Lead 54 extends from the plastic molding compound of the semiconductor package and may be used for electrical connection to external circuitry or to a specific voltage potential. (Practitioners in the art will appreciate that the cross-hatched areas in FIG. 3 represent metal that is subsequently removed during the manufacturing of package 53.)

Figure 4A:
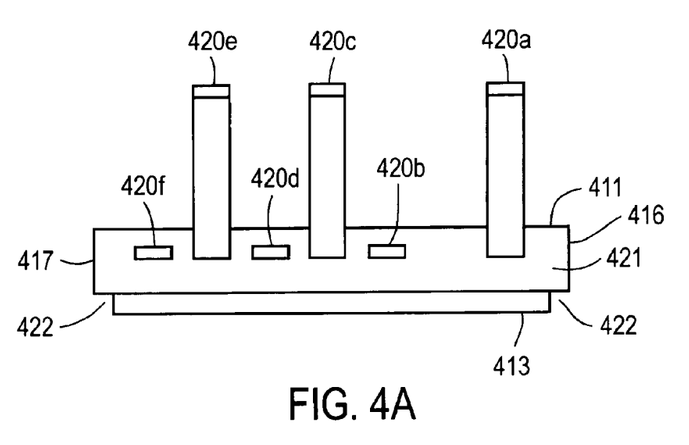
FIG. 4A illustrates an example side view of a semiconductor package with optional lead forming.
Figure 4B:
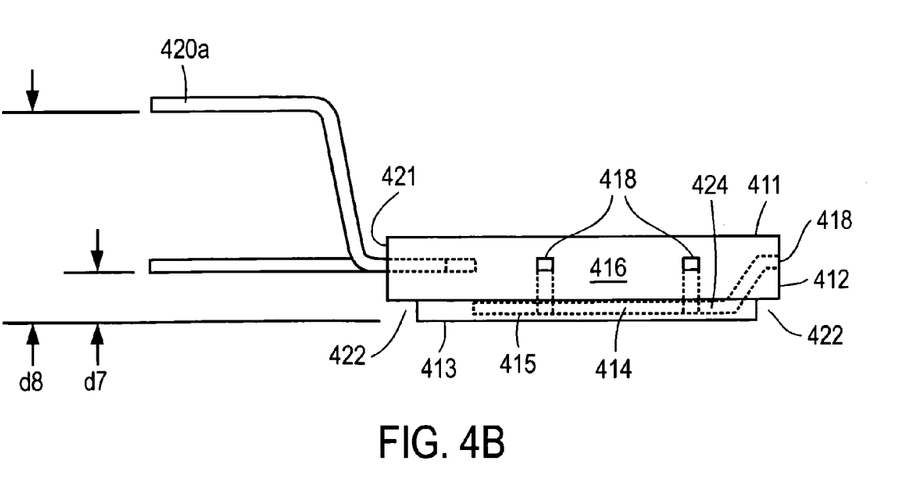
FIG. 4B is a side view of the semiconductor package shown in FIG. 4A.

FIG. 4A illustrates an example side view of a semiconductor package with optional lead forming. The side view of FIG. 4A is taken from the end where leads 420 extend out from. That is, the view of FIG. 4A is into side 421, which is the side of the package that leads 420a-420f extend out from. FIG. 4B is a side view of the semiconductor package shown in FIG. 4A. Note that in the examples of FIGS. 4A & 4B, leads 420a, 420c, and 420e have been bent such that these leads (pins) are raised a distance "d8" above the general plane of mounting surface 413. On the other hand, leads 420b, 420d, and 420f extend from side 421 without bending (i.e., substantially straight) such that these leads (pins) are raised a distance "d7" above the general plane of mounting surface 413. This vertical through-air clearance distance d7 is measured from the general plane of the exposed conductor (e.g. leads 420 or tie bars 418) to the mounting surface 413. Clearance may be measured with respect to the leads or the tie bars exposed on the sides of the package. (When the tie bars are disposed in the same general plane as the leads, the two clearance distances are equal.) In the example embodiment shown in FIG. 4B, the semiconductor package is manufactured with a clearance distance d7 of approximately 1.19 mm.

The example package shown in FIGS. 4A and 4B also includes tie bars 418 that connect with die attach pad 414 of leadframe 424. Tie bars 418 are exposed substantially coincident on opposite side surfaces 416 & 417, and also to side surface 412, which is disposed opposite side surface 421. Note that in this embodiment, die attach pad 414 is separated from mounting surface 413 by a thin portion 415 of molding compound. Also, a notch 422 extends around all four lateral sides (i.e., 416, 417, 412, and 421) at the edge substantially coincident with surface 413. In another embodiment, tie bars 418 are not exposed on surface 412, and notch 422 only extends along three of the four lateral sides, i.e., sides 416, 417 and 421, but not along side 412. In still other embodiments, tie bars 418 may be exposed on two adjacent side surfaces, e.g., 412 & 416, with notch 422 extending along lateral sides 412, 416 and 421, but not along side 417.

Figure 5:
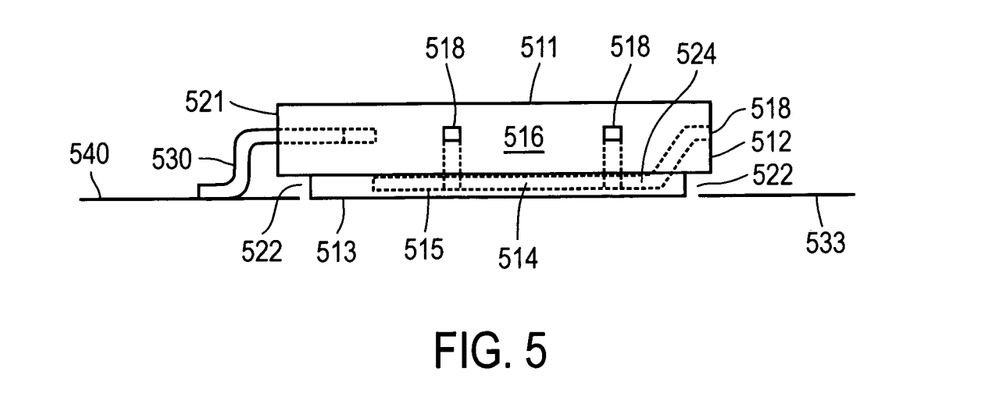
FIG. 5 illustrates an example side exposed view of another semiconductor package with optional lead forming.

FIG. 5 illustrates an example side exposed view of another semiconductor package with optional lead forming. The package of FIG. 5 is similar to the embodiment of FIGS. 4A & 4B in every respect, except that it is mounted with the mounting surface 513 mechanically coupled to a seating surface 533 of a PCB. That is, mounting surface 513 lies in the same general plane as the PCB seating surface 533. To accommodate the surface mounting of the package, the leads or pins 530 extend out from the surface 521 and are shown bent twice (down and outward) in order to make electrical contact with metal pads or traces 540 located on PCB seating surface 533. In this embodiment, the PCB material is employed as a heatsink to transfer heat away from the semiconductor die mounted on die attach pad 514. Like the previous embodiment, die attach pad 514 of leadframe 524 is separated from mounting surface 513 by a thin portion 515 of molding compound. Notch 522 ensures that the minimum creepage distance from the tie bars 518 and leads 530 to PCB seating surface 533 is substantially more than the clearance distance from the tie bars 518 and leads 530 to seating surface 533 (which acts as the heatsink). Tie bars 518 are shown exposed on two adjacent side surfaces, e.g., 512 & 516.

Figure 6:
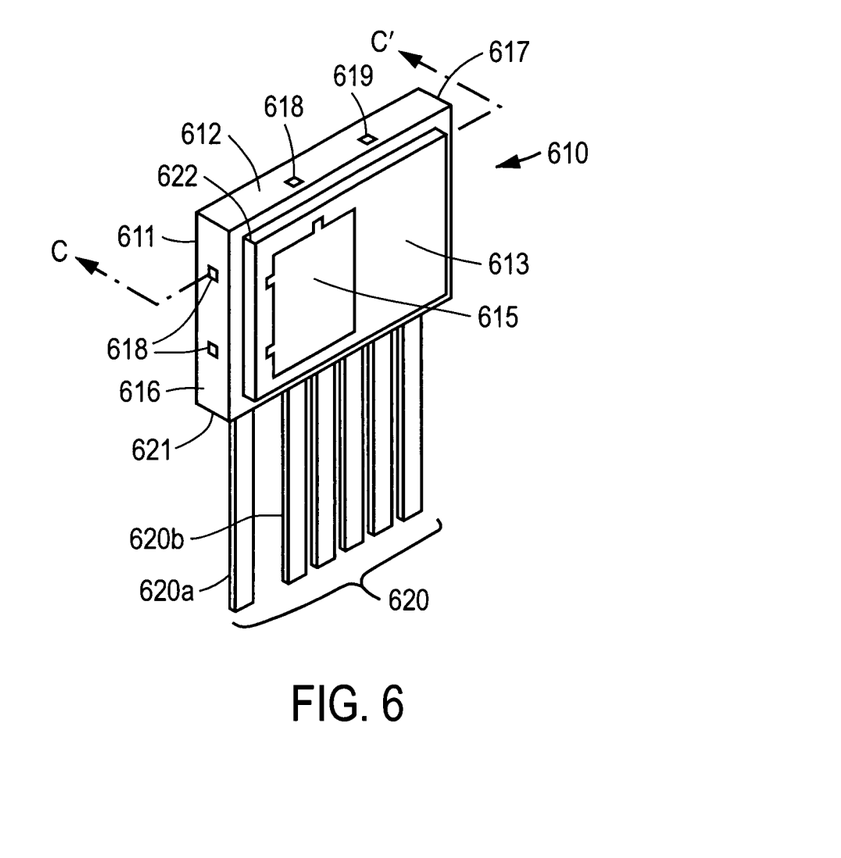
FIG. 6 illustrates a bottom side perspective view of another example semiconductor package.

FIG. 6 illustrates a bottom side perspective view of another example semiconductor package 610 which includes a bottom side or mounting surface 613 having an exposed metallic bottom surface of a die attach pad 615 that is connected with tie bars 618. Tie bars 618 are shown exposed on package side surfaces 616 and 612. An additional tie bar 619 is also shown exposed on side 612. Tie bar 619 is attached to a separate die attach pad that is not exposed on mounting surface 613. This separate die attach pad is illustrated and discussed in more detail below in connection with FIG. 7. It is appreciated that the lead frame of package 610 may be manufactured as part of an array or matrix.

Figure 7:
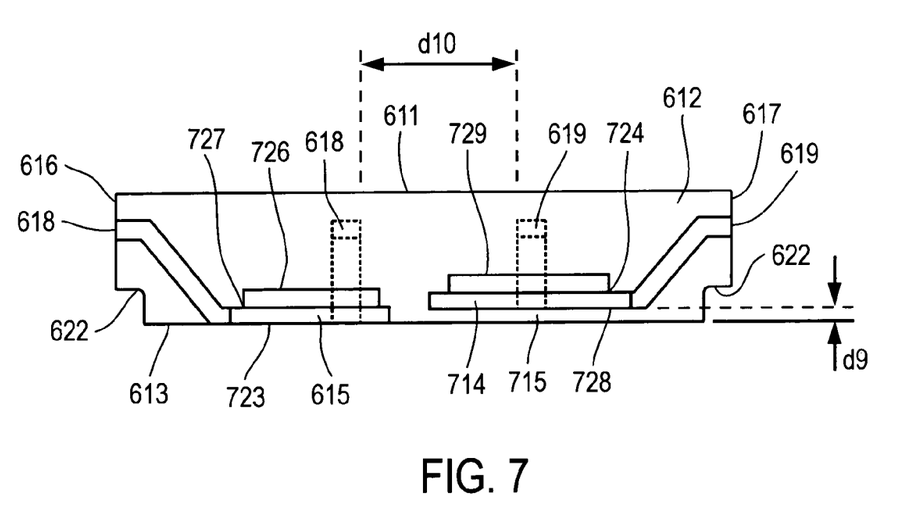
FIG. 7 is a cross-sectional view (as taken through cut lines C-C') of the semiconductor package shown in FIG. 6.

FIG. 7 is a cross-sectional view (as taken through cut lines C-C') of the semiconductor package shown in FIG. 6. This view shows die attach pad 615 deeply downset in a vertical direction below the general plane where tie bars 618 are disposed. The amount of vertical downset of die attach pad 615 is such that the exposed metallic bottom surface 723 of die attach pad 615 lies in the same general plane as mounting surface 613. In other words, the bottom surface of die attach pad 615 is substantially coincident with or exposed flush with mounting surface 613. A first semiconductor die 726 is shown solder-bonded or epoxy glued to an interior top surface 727 of die attach pad 615.

FIG. 7 also shows a second die attach pad 714 downset in a vertical direction below the general plane where tie bars 619 are disposed. Note that the side view of FIG. 7 illustrates another tie bar 619 exposed on side surface 617. Additional tie bars 619 may extend out to the sides 612 & 617 from die attach pad 714. A bottom surface 728 of die attach pad 714 is separated from mounting surface 713 by a portion 715 of semiconductor package molding material having a thickness d9. In one embodiment thickness d9 is about 0.3 mm. A second semiconductor die 729 is shown solder-bonded or epoxy glued to an interior top surface 724 of die attach pad 714. In another embodiment, die attach pads 714 and 615 lie in the same general plane.

Practitioners in the semiconductor arts will appreciate that semiconductor dies 726 and 729 may operate at different voltage potentials. For instance, in one implementation the substrate of semiconductor die 726 may be coupled to ground potential, whereas the substrate of semiconductor die 724 is coupled to a high voltage potential, or some potential other than ground. Consequently, creepage and clearance distance requirements are to be considered between exposed conductors connected to the respective die attach pads. For example, with respect to package 610 shown in FIGS. 7 & 8, distance d10 should meet the creepage distance requirement between respective exposed conductors coupled to die attach pads 615 and 714. It is appreciated that the applicable creepage and clearance distances requirements are dependent on the use of the semiconductor package and the actual voltage differential between die attach pads 615 and 714 during normal operation.

Figure 8:
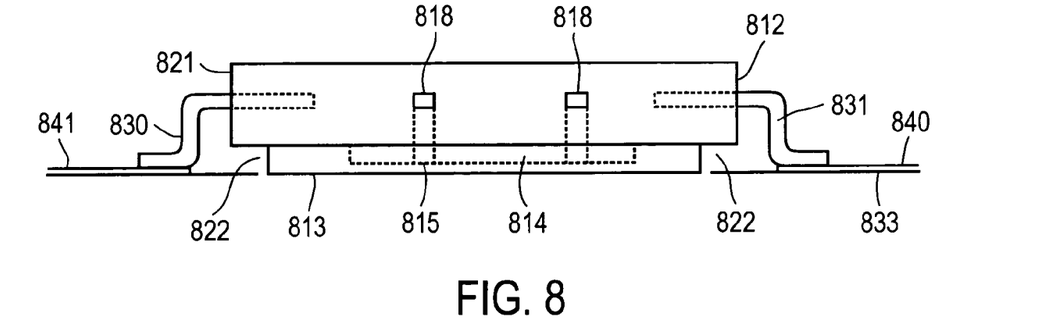
FIG. 8 illustrates an example side exposed view of a semiconductor package with leads extending from more than one package side.

FIG. 8 illustrates an example side exposed view of a semiconductor package with leads extending from more than one side of the package. In this embodiment one or more leads 830 extend from side 821 and one or more leads 831 extend from side 812. Mounting surface 813 is mechanically coupled to a PCB seating surface 833. That is, mounting surface 813 lies in the same general plane as the seating surface 833 of the PCB. Leads 830 and 831 are bent in order to make electrical contact with respective metal pads or traces 841 and 840 located on surface 833 of the PCB. In the embodiment shown, PCB 833 is employed as the primary heatsink for transferring heat away from the semiconductor die mounted on die attach pad 814. In one embodiment the heat transfer to PCB 833 is improved by patterning a metal pad on the top surface of PCB 833 directly underneath bottom side 813 of the package. The presence of notch 822 ensures that the minimum (clearance) distance between tie bars 818 and heatsink 833 is substantially less than the creepage distance between tie bars 818 and heatsink 833.

It is appreciated that in an alternative embodiment, leads 830 and 831 may be bent for insertion into or through holes fabricated in the PCB material. In yet another embodiment leads may be bent in the opposite direction so that mounting surface 813 is on the top to allow attachment of a heat sink to the top of the package by using a spring clip, epoxy or other ordinary attachment mechanism.

Although the present invention has been described in conjunction with specific embodiments, those of ordinary skill in the arts will appreciate that numerous modifications and alterations are well within the scope of the present invention. Accordingly, the specification and drawings are to be regarded in an illustrative rather than a restrictive sense.

We claim:

1. A package for a semiconductor die comprising:
a die attach pad providing an attachment surface area for the semiconductor die;
a plurality of leads:
one or more tie bars integrally connected to the die attach pad, the die attach pad being disposed in a first general plane and the one or more tie bars being disposed in a second general plane, the first general plane being offset with respect to the second general plane;
a molding compound that encapsulates the semiconductor die in a form having first, second, third and fourth lateral sides, a top and a bottom, one or more of the leads extending out from the first lateral side, the one or more tie bars being exposed substantially coincident with the second and third lateral sides, the form including a discontinuity that extends along at least a portion of the first lateral side and along the at least a portion of the second and third lateral sides where the one or more tie bars are exposed, the discontinuity comprising a notch disposed coincident with the bottom of the package, the notch increasing a creepage distance from the one or more tie bars to the bottom of the package; and
wherein a ratio of a clearance distance to the creepage distance of the package is greater than 1:1.2, the clearance distance being measured through air from a third general plane coincident with a bottom: edge of the one or more tie bars to a fourth general plane coincident with the bottom of the package.

2. The package of claim 1 wherein the bottom provides a mounting surface for mechanical coupling to a heatsink.

3. The package of claim 1 wherein a portion of the molding compound separates an underside of the die attach pad from the bottom of the package.

4. The package of claim 1 wherein a bottom surface of the die attach pad is exposed flush with the bottom of the package.

5. A package for a semiconductor die comprising:
a body having a plurality of side surfaces and a bottom mounting surface for mechanical coupling to a heatsink;
a leadframe that includes one or more electrically conductive tie bars and a die attach pad that provides an attachment surface area for the semiconductor die, the die attach pad and the semiconductor die being encapsulated within the body, the one or more electrically conductive tie bars being integrally connected to the die attach pad, the one or more tie bars being disposed in a first general plane and the die attach pad being disposed in a second general plane, the second general plane being offset from the: first general plane and nearest to the bottom mounting surface, the one or more tie bars being exposed substantially coincident with at least two of the side surfaces;
the body further having a discontinuity that extends along at least a portion of the side surfaces directly beneath where the one or more tie bars are exposed, the discontinuity increasing a creepage distance from the tie bars to the bottom mounting surface; and
wherein a ratio of a clearance distance to the creepage distance of the package is greater than 1;1.2, the clearance distance being measured through air from a third general plane coincident with a bottom: edge of the one or more tie bars to a fourth general plane coincident with the bottom mounting surface.

6. The package of claim 5 wherein a portion of the body separates an underside of the die attach pad from the bottom mounting surface.

7. The package of claim 5 wherein the discontinuity comprises a notch disposed coincident with the bottom mounting surface.

8. The package of claim 5 wherein the discontinuity comprises a step disposed coincident with the bottom mounting surface.

* * * * *